United States Patent [19]

Craft

[11] Patent Number: 5,019,941
[45] Date of Patent: May 28, 1991

[54] ELECTRONIC ASSEMBLY HAVING ENHANCED HEAT DISSIPATING CAPABILITIES

[75] Inventor: Scott Craft, Phoenix, Ariz.

[73] Assignee: Motorola, Inc., Schaumburg, Ill.

[21] Appl. No.: 431,422

[22] Filed: Nov. 3, 1989

[51] Int. Cl.⁵ .............................................. H05K 7/20
[52] U.S. Cl. .................................. 361/386; 174/16.3; 357/81; 361/388; 361/400; 361/403
[58] Field of Search .............................. 361/386–389, 361/400, 403, 414; 357/81; 174/16.3; 165/80.3, 185

[56] References Cited

U.S. PATENT DOCUMENTS 4,729,061  3/1988  Brown .................................. 361/386
4,739,448  4/1988  Rowe et al. ......................... 361/386

FOREIGN PATENT DOCUMENTS 0308296  3/1989  European Pat. Off. ............ 361/386
0307768  12/1988  Japan .................................... 361/386

OTHER PUBLICATIONS

Tiffany, "Integrated Circuit Package and Heat Sink", *IBM Technical Disclosure Bulletin*, vol. 13, No. 7, Jun. 1970, p. 58.
Goldman, "Heat Dissipative Chip Carriers", *IBM Technical Disclosure Bulletin*, vol. 14, No. 12, May 1972, p. 3850.

Primary Examiner—Gregory D. Thompson
Attorney, Agent, or Firm—Charles R. Lewis

[57] ABSTRACT

Heat removal is accomplished by utilizing a first metal conductive pad to conduct the heat from an electrical component. The first pad is juxtaposed and thereby thermally coupled by convection to one or more ground pads having plated through holes to a ground plane and heat sink.

16 Claims, 4 Drawing Sheets

ELECTRONIC ASSEMBLY HAVING ENHANCED HEAT DISSIPATING CAPABILITIES

RELATED INVENTIONS

The present invention is related to the following inventions, all assigned to the assignee of the present invention:

Thermal Shunt for Electronic Circuits, invented by Scott Craft, having Ser. No. 07/334,409, and filed on Apr. 7, 1989;

Hybrid Amplifier, invented by Craft et al., having Ser. No. 07/380,230, and filed on July 14, 1989; and VHF Power Amplifier, invented by Scott Craft, having Ser. No. 07/431,801, and filed on Nov. 6, 1989.

FIELD OF THE INVENTION

The present invention relates, in general, to a means for dissipating heat generated by components in an electronic assembly and, more particularly, to a means for dissipating heat generated by surface mount components in an electronic assembly.

BACKGROUND OF THE INVENTION

It is common in the electronics arts to form electronic assemblies containing many different electronic components attached to a board, such as a printed circuit board (PCB). A printed circuit board is typically comprised of an insulator (e.g. paper, plastic, glass, or the like) substrate having metalization placed on one or both surfaces. The metalization is provided by transfer techniques or by deposition and etching techniques.

A problem often encountered in circuit layouts is that of providing heat dissipation for high power components. An example of the heat to be dissipated by surface mount devices may be illustrated by an SO-8 package. The SO-8 has a thermal resistance in the range of 45° C./watt. An SOT-23 has a thermal resistance in the range of about 220° C./watt.

The heat problem is amplified by the need to place the circuit on as small a surface area as possible. This makes the thermal resistance of the board and its ability to dissipate heat very important.

In the past, various attempts have been made to reduce the thermal resistance of components mounted on circuit boards. Ceramic materials such as alumina or beryllia have been used as circuit board substrates. However, these are very expensive.

Another alternative is the use of stud mounted electronic components. These provide a metallic stud in the component package on which a semiconductor chip is mounted. The stud passes through a hole in the circuit board and attaches directly to an underlying heat sink. The problem with stud type packaging is that they are not useful for surface mount devices and it is difficult to provide for electronic isolation of the stud from the heat sink (typically located on a second surface of the circuit board).

A third alternative is the use of a hole in the circuit board through which a portion of the external heat sink may protrude. This would place the external heat sink in direct contact with the component or component package. However, this arrangement is not useful with many different types of components and often does not provide sufficient heat removal from plastic encapsulated components.

None of the foregoing techniques are suitable for electronic assemblies when very low cost is an important consideration, and particularly when surface mount components are desired.

Accordingly, it is an object of the present invention to provide an electronic assembly having enhanced heat dissipating capabilities which overcome the above deficiencies and provides the desired advantages.

A further object of the present invention is to provide an electronic assembly having enhanced heat dissipating capabilities which improve the transmission of heat from the source to a heat sink.

Another object of the present invention is to provide an electronic assembly having enhanced heat dissipating capabilities which reduce the resistance from the heat source to the heat sink.

Still another object of the present invention is to provide an electronic assembly having enhanced heat dissipating capabilities which is economical to produce.

Yet another object of the present invention is to provide an electronic assembly having enhanced heat dissipating capabilities which utilize surface mount electronic components.

These and other objects and advantages are achieved in accordance with a preferred embodiment of the invention described below.

SUMMARY OF THE INVENTION

A particular embodiment of the present invention consists of an electronic assembly having at least one heat generating component. The leads through which the heat is conducted out of the package of the heat generating component are coupled to conductive pads on a circuit board. The metalization of these pads is disposed under the package containing the component and is juxtaposed to a second metal conductor having plated through holes connecting the second connector to a ground plane. The heat is transmitted through the leads of the component to the metalized pads. The second metal conductor is heated by means of convection from the first metalized pads which pass the heat through the plated through holes to the ground plane. The ground plane being coupled to a heat sink.

DETAILED DESCRIPTION OF THE DRAWINGS

Figure 1:
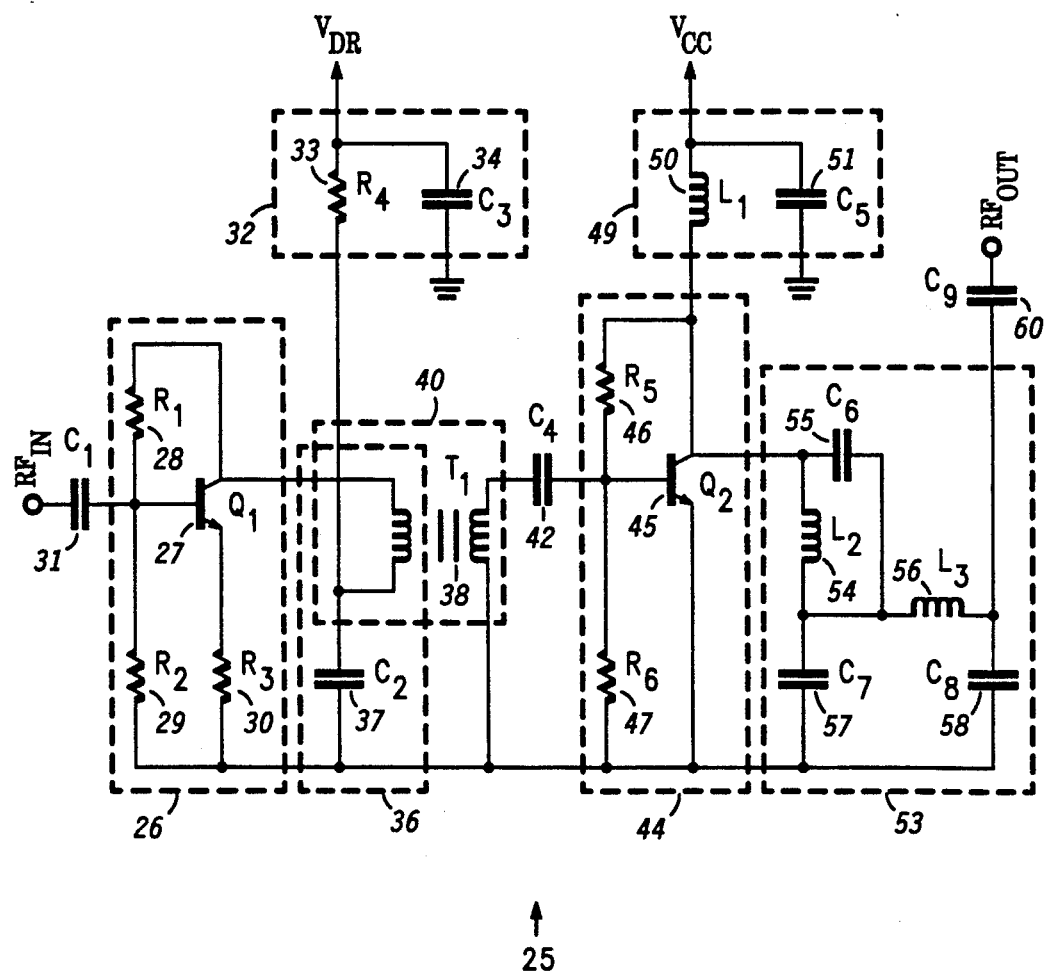
FIG. 1 is a circuit diagram of an electronic assembly which may be mounted on the present invention.

Referring initially to FIG. 1, a circuit diagram, generally designated 25, of an amplifier is illustrated. Circuit 25 consists of a first amplifying stage 26. Stage 26 consists of a transistor ($Q_1$) 27 coupled in common emitter configuration and operating in class A mode. An example of transistor 27 is an SRF5406 manufactured by Motorola ® Inc.

A resistor ($R_1$) 28 is coupled between the collector and base of transistor 27. A pair of resistors 29 and 30

($R_2$ and $R_3$) are coupled between a ground and the base and emitter, respectively, of transistor 27. Resistors 28-30 are used to bias transistor 27 to operate in class A mode (e.g. always "on").

The input signal is coupled to the base of transistor 27 through a capacitor ($C_1$) 31. Capacitor 31 serves to provide RF coupling and DC blocking of the input signal.

The collector of transistor 27 is coupled to a degeneration circuit 32. Degeneration circuit 32 consists of a resistor ($R_4$) 33 and a capacitor ($C_3$) 34. Resistor 33 is coupled between a driver voltage ($V_{DR}$) and the collector of transistor 27. As will be illustrated below, the drive voltage is provided to permit tuning of stage 26. If there is no need to tune circuit 25, then the drive voltage may be the supply voltage ($V_{cc}$). Capacitor 34 is coupled between the drive voltage and ground.

Degeneration circuit 32 is provided to limit the power dissipation in transistor 27. Without degeneration circuit 32, the power dissipated in transistor 27 would result in heat problems that may damage the transistor. The degeneration circuit is provided on the collector side of transistor 27 to avoid problems in impedance matching which would result if coupled on the emitter side.

By varying the voltage ($V_{DR}$), the gain of transistor 27 may be varied. In changing the voltage VDR, the emitter current is varied which in turn effects the collector current. The relation of the emitter current to the voltage $V_{DR}$ is provided in equation (1) below:

$$I_E = \frac{R_2^{2*}(b+1) * V_{DR} - R_2 * (b+1) * V_{BE}^* (R_4 + R_1 + R_2)}{R_2^* (b+1) * R_3 * (R_2 + R_1 + R_4) + R_2^{2*} (R_1 + R_4 + (b*R_4))}. \quad (1)$$

The collector current is then related to the emitter current by equation (2):

$$I_c = \frac{b * I_E}{(b+1)} \quad (2)$$

As indicated above, if there is no need to tune the amplifier, the voltage $V_{DR}$ may be coupled directly to the supply voltage ($V_{CC}$).

Circuit 25 also contains a first decoupling circuit 36. In this particular embodiment, decoupling circuit 36 consists of a capacitor 37 and an inductor provided by half of a transformer 38. Decoupling circuit 36 is provided to remove any unwanted signal or noise components from the driver voltage ($V_{DR}$).

The output of stage 26 is input to a coupling circuit 40, here transformer 38. Transformer 38 was selected as the coupling circuit in order to provide impedance matching between stage 26 and a second stage 44. Other types of coupling between stages may be used in place of transformer including direct coupling, R-C coupling, etc.

The output of coupling circuit 40 is coupled to the input of stage 44 through a capacitor ($C_4$) 42. Capacitor 42 provides RF coupling and DC blocking of the input signal, much the same as capacitor 31 does for stage 26.

Stage 44 consists of a transistor ($Q_2$) 45 in common emitter configuration and biasing resistors ($R_5$ and $R_6$) 46 and 47. An example of transistor 27 is a SRF5401 manufactured by Motorola ® Inc. Resistors 46 and 47 are used to bias transistor 27 to operate in a class C mode (e.g. no bias base current). Resistor 46 also provides feedback between the collector and base providing improvement in the stability margin of stage 44.

A second decoupling circuit 49 consisting of an inductor ($L_1$) 50 coupled between the supply voltage ($V_{CC}$) and the collector of transistor 45 and a capacitor ($C_5$) 51 coupled between the supply voltage and ground. Decoupling circuit 49 is provided to remove any unwanted signal or noise from the supply voltage ($V_{CC}$).

A filter 53 is coupled to the output of stage 44. Filter 53 is provided to remove harmonics from the output signal and to provide impedance matching. In the present embodiment, filter 53 consists of a band stop filter and a low pass filter. The band stop filter is principally comprised of an inductor ($L_2$) 54 and capacitor ($C_6$) 55. In the present embodiment, the band stop operates at 270 mhz. The low pass filter is comprised of an inductor ($L_3$) 56 and a pair of capacitors ($C_7$ and $C_8$) 57 and 58.

The output of filter 53 is coupled to the output of circuit 25 through a capacitor ($C_9$) 60. Capacitor 60 provides RF coupling and DC blocking of the output signal.

Figure 2:
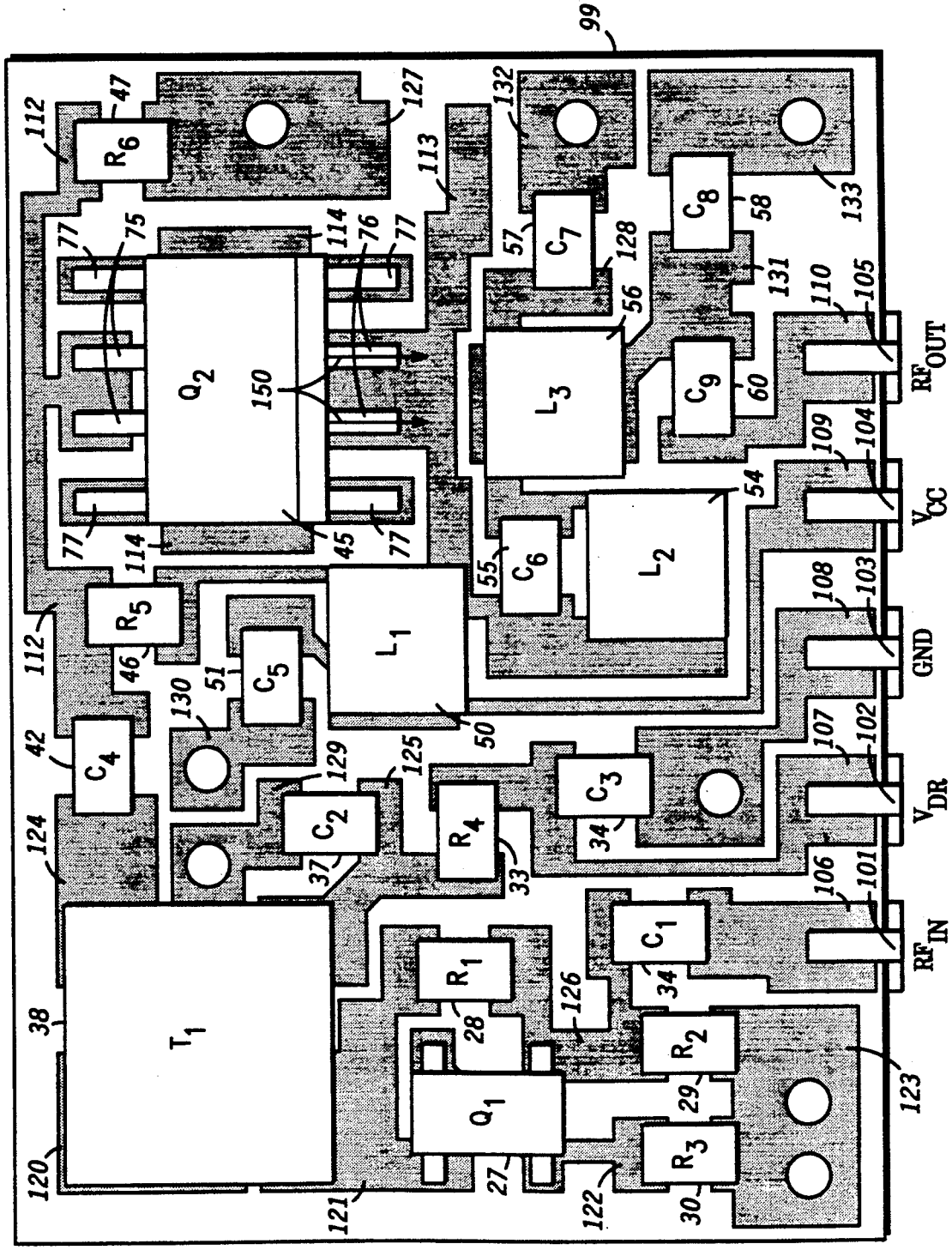
FIG. 2 is a diagram of a printed circuit board embodying the present invention with the components in place.
Figure 3:
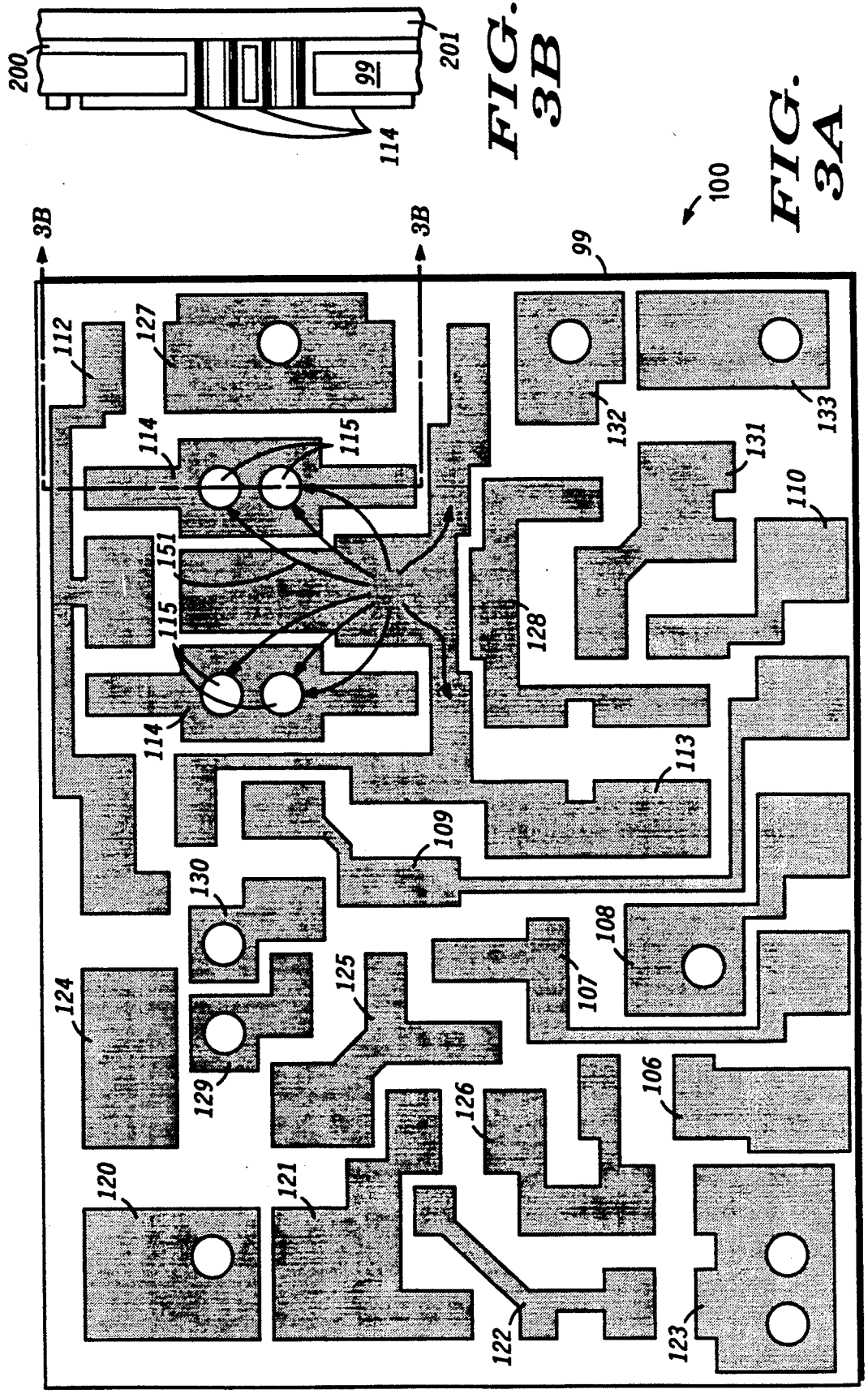
FIG. 3A is a diagram of the printed circuit board of FIG. 2 with the components removed.
FIG. 3B is a partial cross sectional view of the printed circuit board of FIG. 3A taken along the lines 3B—3B in FIG. 3A.

Referring now to FIGS. 2, 3A, and 3B, a diagram of a printed circuit board, generally designated 100, embodying the present invention is illustrated. The components on board 100 are shown in FIG. 2 and are designated by the same numbers used to designate the components of circuit 25, FIG. 1.

Printed circuit board 100 consists essentially of a substrate 99 having metalization on each surface thereof to provide first and second conductive layers on the opposed surfaces with one of the surfaces being a ground plane 200 as illustrated in FIG. 3B. A plurality of metal pads 106–110 ($RF_{IN}$, $V_{DR}$, GND $V_{CC}$, and $RF_{OUT}$, respectively) coupled to connectors 101–105, respectively, provide external connections.

The area of interest on board 100 is the area about transistor 45 ($Q_2$). Transistor 45 has a pair of base leads 75 coupled to a pad 112; a pair of collector leads 76 coupled to a pad 113; and two pair of emitter leads 77 coupled to pads 114. Pad 112 is also coupled to one side of capacitor 42 and resistors 46 and 47. Pad 113 is coupled to one side of inductors 50 and 54, capacitor 55, and resistor 46.

Pads 114 each contain a pair of plated through holes 115. Plated through holes 115 provide connection to a ground plane 200 on the second surface of board 100 by way of the plated walls of the holes 115. Ground plane 200 is attached to a heat sink 201.

In operation, the objective is to remove heat from the component side of board 100 to ground plane 200 and heat sink 201. Since most of the heat from transistor 45 is conducted out of the package along collector leads 76 (see lines 150 of FIG. 2), the objective becomes providing a thermally conductive path from leads 76 to ground plane 200. At the same time, electrical insulation must be provided between the thermally coupled ground and collector leads 76.

To accomplish this, additional metalization of pad 113 is provided between pads 114. This additional metalization is disposed as close to holes 115 of pads 114 as possible without violating manufacturing minimum standards for metalization of pads 114 about holes 115. The main path of conduction for heat from leads 76 then becomes the portion of pad 113 which traverses between pads 114. The heat crosses to pads 114 by connection and travels along the plating of holes 115 to ground plane 200 and heat sink 201. This is illustrated by lines 151.

Board 100 also provides pads 120-133 for coupling the various components of circuit 25 together.

In addition to the heat dissipating considerations, board 100 is designed such that the inductor layouts will not effect one another. To accomplish this, inductors 54 and 56, which are adjacent, are rotated 90° to prevent cross effects. Inductor 50 is isolated from inductors 54 and 56 by distance. The inductance in transformer 38 is also isolated from inductors 50, 54, and 56 by distance.

Further, in an effort to prevent the small signal noise of one component from interfering with another component, each amplifier, filter, and decoupler are provided with separate ground pads.

Figure 4:
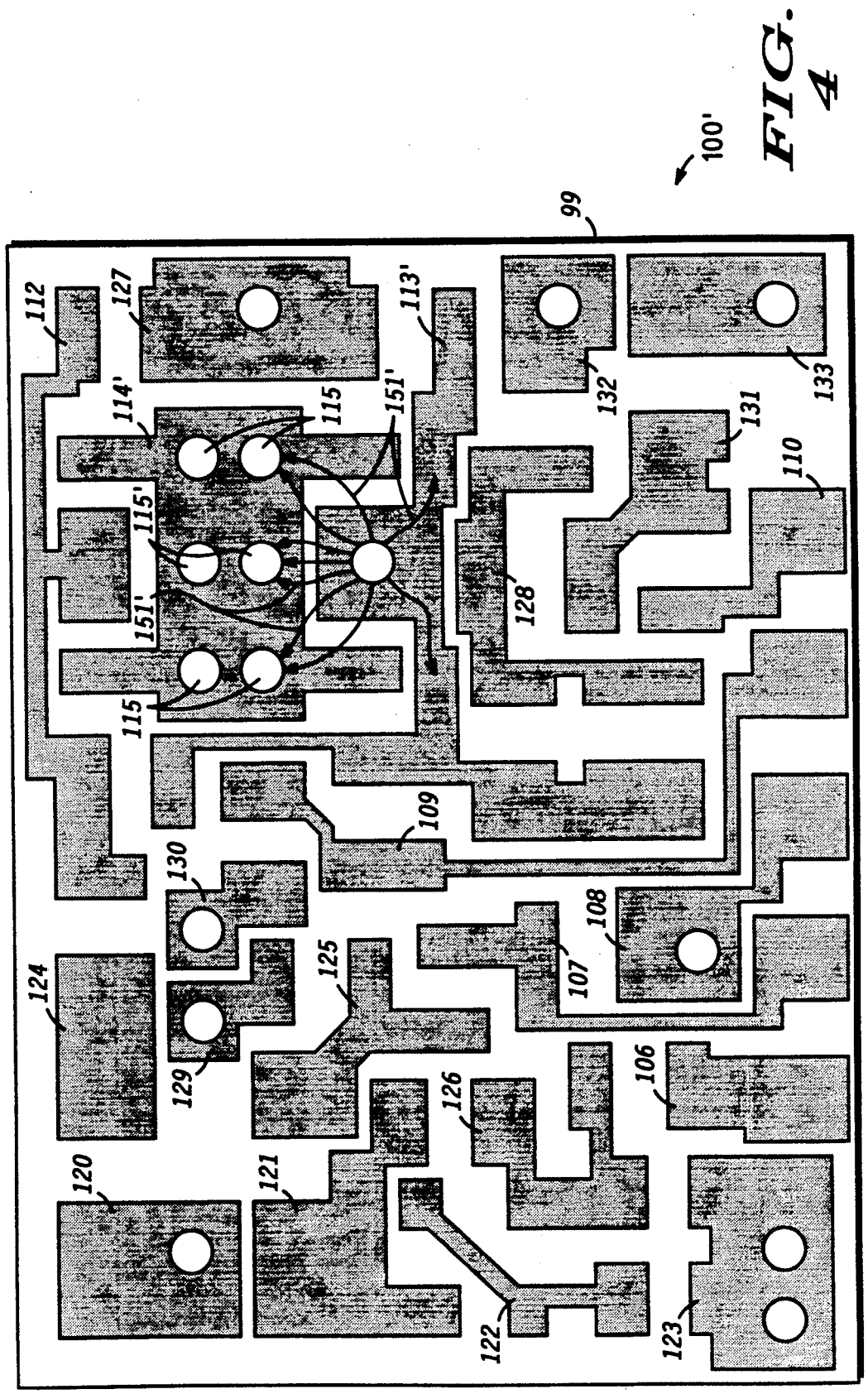
FIG. 4 is a diagram of a printed circuit board illustrating a second embodiment of the present invention.

Referring now to FIG. 4, a second embodiment of a printed circuit board, generally designated 100', embodying the present invention is illustrated. The primary difference between board 100, FIG. 3, and board 100' is found in the form of pads 113 and 114. Pads 114 have been coupled together to form one pad 114'. Pad 113 has had the portion extending beneath the package of transistor 45 removed.

Again, the metalization of pad 113' is disposed as close to holes 115 as possible without violating manufacturing standards. The main path of conduction for heat from leads 76 then becomes pad 113'. The heat crosses to pads 114' by convention and travels along the plating of holes 115 to ground plane 200 and heat sink 201. This is illustrated by lines 151'.

As described above, a device has been shown which accomplishes the objectives of providing the desired heat dissipation in an economical fashion.

Thus, it will be apparent to one skilled in the art that there has been provided in accordance with the invention, a method that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:

1. An electronic assembly comprising:
   a substrate having first and second conductive layers on first and second opposed surfaces, respectively;
   a first conductive pad of said first conductive layer having a first and a second edge;
   a second conductive pad of said first conductive layer having an edge thereof juxtaposed and thermally coupled by convection to said first edge of said first conductive pad, said second conductive pad being thermally coupled to said second conductive layer; and
   a heat generating electrical component having heat conductive leads coupled to at least said first conductive pad and heat from said first conductive pad thermally coupled to said second conductive layer by way of said second conductive pad.

2. An electronic assembly of claim 1 wherein said second conductive pad is thermally coupled to said second conductive layer by a first conductive well defining an opening extending from said second conductive pad to said second surface of said substrate.

3. An electronic assembly of claim 2 further comprising a third conductive pad of said first conductive layer having an edge thereof juxtaposed to said second edge of said first conductive pad to thermally couple by convection said first conductive pad to said third conductive pad.

4. An electronic assembly of claim 3 further comprising a second conductive wall 115 defining an opening extending from said third conductive pad 114 to said second conductive layer of said substrate, said second conductive wall thermally coupling said first conductive pad 113 of said first layer of said substrate to said second 200 conductive layer of said substrate by way of said third conductive pad 114.

5. An electronic assembly of claim 1 further comprising a plurality of external connectors 101-105 coupled to said first conductive layer.

6. An electronic assembly of claim 5 wherein said heat generating electrical component $Q_2$ is disposed on at least said first conductive pad 113.

7. An electronic assembly comprising:
   a substrate having first and second conductive layers on first and second opposed surfaces, respectively;
   a first conductive pad of said first conductive layer having a first and second edge;
   a second conductive pad of said first conductive layer having an edge thereof juxtaposed to said first edge of said first conductive pad whereby said first conductive pad is thermally coupled by convection to said second conductive pad;
   a third conductive pad of said first conductive layer having an edge thereof juxtaposed to said second edge of said first conductive pad whereby said first conductive pad is thermally coupled by convection to said third conductive pad;
   a heat generating electrical component having heat conductive leads being coupled to said first conductive pad; and
   a first thermally conductive wall defining an opening extending from said second conductive pad to said second surface of said substrate.

8. An electronic assembly of claim 7 further comprising a second thermally conductive wall defining an opening extending from said first surface to said second surface of said substrate, said second conductive wall thermally coupling said third conductive pad of said first layer of said substrate to said second conductive layer of said substrate thereby thermally coupling said first conductive pad to said second conductive layer by way of said third conductive pad.

9. An electronic assembly of claim 7 further comprising a plurality of external connectors 101-105 coupled to said first conductive layer.

10. An electronic assembly of claim 9 wherein said heat generating electrical component $Q_2$ is disposed on at least said first conductive pad 113.

11. An electronic assembly comprising:
    a substrate having a first conductive layer disposed on a first surface of said substrate;
    a heat sink being coupled to a second surface of said substrate;
    a first conductive pad of said first conductive layer having a first and a second edge;
    a second conductive pad of said first conductive layer having an edge thereof juxtaposed to said first edge of said first conductive pad to thermally couple by convection said first and second conductive pads, said second conductive pad being thermally coupled to said heat sink; and a heat generating electrical component having heat conductive leads being coupled to said first conductive pad.

12. An electronic assembly of claim 11 further comprising a first conductive wall of a plated through hole defining an opening extending from said first surface to said second surface of said substrate, said first conductive wall thermally and electrically coupling said second conductive pad of said first layer of said substrate to said heat sink.

13. An electronic assembly of claim 11 further comprising a third conductive pad of said first conductive layer having an edge thereof juxtaposed to said second edge of said first conductive pad to thermally couple by convection said first and third conductive pads.

14. An electronic assembly of claim 13 further comprising a second conductive wall of a plated through hole defining an opening extending from said first surface to said second surface of said substrate, said second conductive wall thermally and electrically coupling said third conductive pad of said first layer of said substrate to said heat sink.

15. An electronic assembly of claim 11 further comprising a plurality of external electrical connectors 101–105 coupled to said first conductive layer along a first edge of said substrate.

16. An electronic assembly of claim 14 wherein said heat generating electrical component $Q_2$ is disposed on said first second and third conductive pads.

* * * * *

UNITED STATES PATENT AND TRADEMARK OFFICE
CERTIFICATE OF CORRECTION

PATENT NO. : 5,019,941

DATED : May 28, 1991

INVENTOR(S) : Scott Craft

It is certified that error appears in the above-identified patent and that said Letters Patent is hereby corrected as shown below:

Column 5, line 66, claim 2, change "well" to --wall--.

Signed and Sealed this

First Day of December, 1992

Attest:

DOUGLAS B. COMER

*Attesting Officer*  Acting Commissioner of Patents and Trademarks